United States Patent
Nour et al.

(10) Patent No.: US 12,525,541 B2
(45) Date of Patent: Jan. 13, 2026

(54) POWER CONVERTER ASSEMBLY

(71) Applicant: DANMARKS TEKNISKE UNIVERSITET, Kongens Lyngby (DK)

(72) Inventors: Yasser A.A. Nour, Kongens Lyngby (DK); Hoà Lê Thanh, Kongens Lyngby (DK); Ahmed Morsi Ammar, Kongens Lyngby (DK); Dennis Øland Larsen, Kongens Lyngby (DK); Pere Llimós Muntal, Kongens Lyngby (DK)

(73) Assignee: DANMARKS TEKNISKE UNIVERSITET, Kongens Lyngby (DK)

( * ) Notice: Subject to any disclaimer, the term of this patent is extended or adjusted under 35 U.S.C. 154(b) by 518 days.

(21) Appl. No.: 17/926,355

(22) PCT Filed: May 21, 2021

(86) PCT No.: PCT/EP2021/063689
§ 371 (c)(1),
(2) Date: Nov. 18, 2022

(87) PCT Pub. No.: WO2021/234158
PCT Pub. Date: Nov. 25, 2021

(65) Prior Publication Data
US 2023/0197624 A1    Jun. 22, 2023

(30) Foreign Application Priority Data
May 22, 2020   (EP) .................................. 20176041

(51) Int. Cl.
*H01L 23/538* (2006.01)
*H01L 23/053* (2006.01)
(Continued)

(52) U.S. Cl.
CPC ........ *H01L 23/5384* (2013.01); *H01L 23/053* (2013.01); *H01L 23/49811* (2013.01);
(Continued)

(58) Field of Classification Search
None
See application file for complete search history.

(56) References Cited

U.S. PATENT DOCUMENTS 9,740,079 B1 *   8/2017   Davids ................. G02B 6/1347
9,761,547 B1 *   9/2017   Kunkee ............... H01L 23/5385
(Continued)

FOREIGN PATENT DOCUMENTS

| WO | 2011103259 A2 | 8/2011 |
| WO | 2016073959 A1 | 5/2016 |
| WO | 2019155056 A1 | 8/2019 |

OTHER PUBLICATIONS

Chui K et al: "High Aspect Ratio (10:1) Via-Middle TSV with High-k Dielectric Liner Oxide", 2019 IEEE 21st Electronics Packaging Technology Conference (EPTC), IEEE, Dec. 4, 2019 (Dec. 4, 2019), pp. 721-724, XP033732058, DOI: 10.1109/EPTC47984.2019.9026683 (Year: 2019).*
(Continued)

*Primary Examiner* — Cory W Eskridge
(74) *Attorney, Agent, or Firm* — Dinsmore & Shohl LLP

(57) ABSTRACT

A power converter assembly includes an interposer; an integrated circuit, such as a power management integrated circuit, arranged in a cavity or pocket of the interposer or monolithically integrated in the interposer; one or more electrical components stacked on a top side of the interposer; and one or more vias arranged in the interposer forming electrical connections in the interposer, wherein the inte-
(Continued)

grated circuit and the electrical components are configured to perform a power conversion of an input voltage to an output voltage.

18 Claims, 8 Drawing Sheets

(51) Int. Cl.
  *H01L 23/498*    (2006.01)
  *H01L 25/16*    (2023.01)
  *H02M 3/00*    (2006.01)
  *H01L 23/00*    (2006.01)

(52) U.S. Cl.
  CPC .......... *H01L 25/165* (2013.01); *H02M 3/003* (2021.05); *H01L 24/16* (2013.01); *H01L 2224/16225* (2013.01)

(56) References Cited

U.S. PATENT DOCUMENTS

| | | | | |
|---|---|---|---|---|
| 2013/0076322 A1* | 3/2013 | Tateno | .................. | H02M 3/158 323/271 |
| 2015/0179610 A1* | 6/2015 | Khan | .................. | H01L 21/4828 257/676 |
| 2016/0113117 A1* | 4/2016 | Liu | ........................ | H05K 1/183 361/720 |
| 2017/0236809 A1* | 8/2017 | Trimberger | ......... | H01L 23/5385 257/777 |
| 2017/0331371 A1 | 11/2017 | Parto | | |
| 2022/0093526 A1* | 3/2022 | Wu | ........................ | H01L 21/56 |
| 2022/0278021 A1* | 9/2022 | Nootens | .............. | H01L 23/5385 |

OTHER PUBLICATIONS

Chui K et al.: "High Aspect Ration (>10:1) Via-Middle TSV with high-k Dielectric Liner Oxide", 2019 IEEE 21st Electronics Packaging Technology Conference (EPTC), IEEE, pp. 721-724,DIO:10. 1109/EPTC47984.2019.9026683, Dec. 4, 2019.

Ding et al.: "A Power Inductor Integration Technology Using a Silicon Interposer for DC-DC Converter Applications", Proceedings of the 30th International Symposium in Power Semiconductor Devices & ICs, May 13-17, 2018.

Mingliang Wang: "Integrated power inductors in silicon for compact dc-dc converters in portable electronics", Dissertation from The University of Florida, 2010.

O'Mathuna Cian: PwrSiP Power Supply in Package Power System in Package, 2016 International Symposium on 3D Power Electronics Integration and Manufacturing (3D-PEIM), IEEE, DOI: 10.1109/ 3DPEIM.2016.7570569, Jun. 13, 2016.

Sridhar et al.: "Exploration of Inductor-Based Hybrid Integrated Voltage Regulator Architectures", 2016 6th Electronic System-integration Technology Conference (ESTC), IEEE, pp. 1-6, DOI:10. 1019/ESTC.2016.7764679, Sep. 13, 2016.

Sun et al.: "Development of GaN Power IC Platform and A11 GaN DC-DC Buck Converter IS", 2019 31st International Symposium on Power Semiconductor Devices and ICS (ISPSD), IEEE, pp. 271-274DOI: 10.1109/ISPSD.2019.8757674, May 19, 2019.

* cited by examiner

POWER CONVERTER ASSEMBLY

CROSS-REFERENCE TO RELATED APPLICATIONS

This application is the U.S. National Stage of PCT/EP2021/063689 filed on May 21, 2021, which claims priority to European Patent Application 20176041.0 filed on May 22, 2020, the entire content of both are incorporated herein by reference in their entirety.

FIELD OF THE INVENTION

The present disclosure relates to a power converter assembly, in particular to a high-power density DC-DC converter manufactured in/on a three dimensional silicon interposer.

BACKGROUND OF THE INVENTION

In smart electronics systems, for example, internet of things (IoTs) devices, light emitting diode (LED) lightings and other consumer electronic products, a general trend is that an increasing number of functions is packed into a limited space. These systems consequently require more compact and more efficient power converters, preferably also with lower manufacturing costs.

Miniaturized power converters play an important role in achieving the aforementioned goals and can be categorized into three categories. The first category is Power systems on chip (PwrSoC), in which all active and passive components are integrated on the same die. The second category is power system in package (PwrSiP) in which individual components of the converter are co-packaged together with a power management integrated circuits die. The third category is power modules in which pre-packaged discrete components are assembled on a printed circuit board.

One challenge with developing smaller power converters is thermal management. The development towards smaller power converters typically implies increased temperature, generally, or at least in certain areas in the power converters. The higher the density, the higher the risk of accidents and power loss due to increased temperature during operation.

There is thus a need for a solution for highly efficient power converters with improved thermal performance.

SUMMARY OF THE INVENTION

The present disclosure therefore relates to an improved high-power density power converter assembly for performing a power conversion of an input voltage to an output voltage. According to a first embodiment, the power converter assembly comprises:
- an interposer;
- an integrated circuit, such as a power management integrated circuit, arranged in a cavity or pocket of the interposer or monolithically integrated in the interposer;
- one or more electrical components stacked on a top side of the interposer; and
- one or more vias in the interposer,
- wherein the integrated circuit and the electrical components are configured to perform a power conversion of an input voltage to an output voltage. Preferably, the one or more electrical components comprise one or more passive electrical components.

Preferably, the interposer is made of a material having a high thermal conductivity. One example of a suitable material for the interposer is silicon. Silicon is also easy to process and relatively cheap. By implementing a 3D integrated power converter using a high thermal conductivity interposer as substrate, the power converter assembly can provide very efficient integrated heat dissipation. FIG. 5 shows an exemplary embodiment of the presently disclosed power converter assembly.

A silicon substrate can be used a carrier for power converter components and provide electrical connectivity between various parts. The substrate may be referred to as a routing substrate or a routing interposer. Passive components (capacitors, inductors and transformers) can be processed in and/or on the interposer.

According to one embodiment, the interposer has a pocket or cavity to host an integrated circuit. More specifically, the integrated circuit may be a power management integrated circuit for a power converter, such as a buck converter. The power management integrated circuit may be configured to perform voltage regulation and/or voltage scaling using the one or more passive electrical components. One or more vias, such as through-silicon vias, arranged in the interposer and forming electrical connections between the passive electrical components and the integrated circuit through the interposer, are filled with, for example, copper and electrically isolated from the interposer. An inductor (and/or other passive components) can then be stacked and attached on top of the interposer.

In a further embodiment, the integrated circuit is monolithically integrated in the interposer. This can be achieved by post-processing the interposer to add through-silicon vias from the top and/or bottom side. An inductor (and/or other electrical components) can then be stacked and attached on top of the interposer. The power converter assembly may further comprise routing layers on both sides of the interposer, the routing layers comprising conductive traces. In this embodiment there is, preferably, insulation layers on both sides of the interposer between the interposer and the routing layers to prevent electrical connection between the interposer and the routing layers. Moreover, as illustrated in the example of FIG. 5, the power converter assembly may comprise top-side pads connected to the passive component(s). Each top-side pad may be connected to one or more bottom-side pads through a plurality of parallel through-interposer-vias, such as through-silicon-vias. In this regard it can be noted that the through-interposer-vias are configured to carry high electrical current of the power converter, which breaks with the common practice of using through-vias to carry signals. Further vias and electrical connections, such as second through-vias form the bottom side to the integrated circuit, or other connections of, for example the integrated circuit is placed in a recess, and/or third through-vias from the top side to the integrated circuit may also be used. The second and/or third through-vias mat typically be much thinner than the through-interposer-vias, which are dimensioned to carry high electrical current.

The inventors have realized that by using a silicon interposer designed to have a high thermal conductivity as a routing substrate and a thermal dissipater, a very small power converter with improved thermal performance can be implemented. Using a silicon substrate allows integration with integrated circuits processes, such as post-processing of the integrated circuits to add through-silicon vias and redistribution layers.

DETAILED DESCRIPTION OF THE INVENTION

Figure 1A:
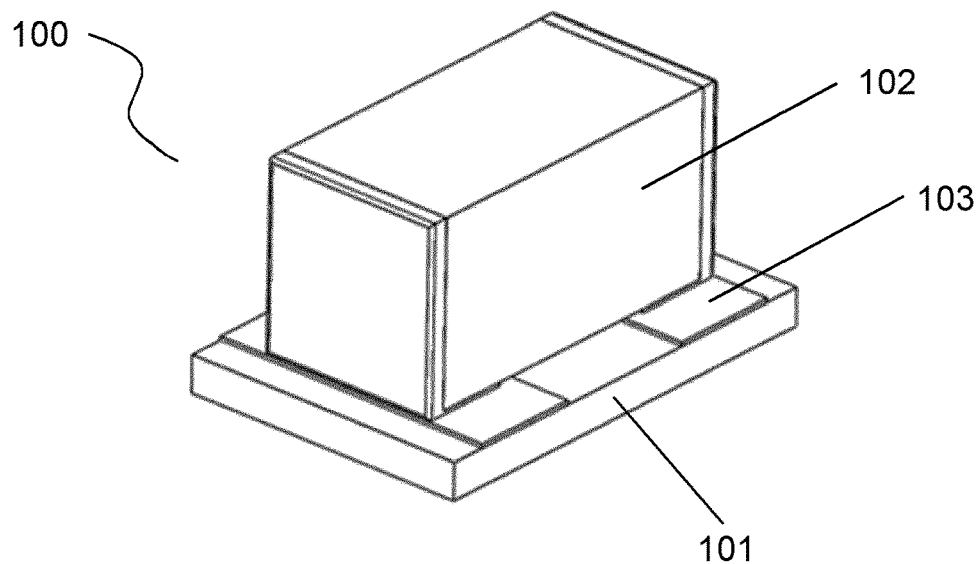
FIG. 1 shows an embodiment of the presently disclosed power converter assembly having an integrated circuit monolithically integrated in an interposer.

The present disclosure relates to power converter assembly comprising an interposer, preferably a silicon interposer. The power converter assembly comprises an active circuit, such as an integrated circuit, which may be, for example, a power management integrated circuit. The active circuit can be monolithically integrated in the interposer. Alternatively, the active circuit can be arranged in a cavity or pocket of the interposer. One or more passive electrical components, such as an inductor, can then be stacked on a top side of the interposer. Preferably, the interposer has one or more through silicon vias forming electrical connections in the silicon substrate. The power converter assembly may take various shapes and configurations, which are described in further detail in the present disclosure. The integrated circuit and the passive electrical components may be configured to perform a power conversion of an input voltage to an output voltage.

An interposer is an electrical interface routing between one socket or connection to another. The conventional purpose of an interposer is to spread a connection to a wider pitch or to reroute a connection to a different connection. An interposer can also be seen as a bridge or a conduit that allows electrical signals to pass through it and onto another element. Interposers are frequently used in multi die chips or boards.

According to a first example, a silicon interposer with a pocket to host a power management circuit for a buck converter is used. This embodiment, in which a cavity or pocket of the interposer is used to host the integrated circuit, has the advantage that third-party integrated circuits, including power management integrated circuits, can be arranged in the cavity. The interposer can then be post-processed to create through silicon vias and routing to make the power assembly complete. The silicon substrate has through silicon vias filled with copper and electrically isolated from the substrate. The buck converter's inductor is then stacked and attached on top of the substrate. According to a second example, a power management integrated circuit of a buck converter is integrated in a silicon die. The silicon die is then post-processed to add through silicon vias and, optionally, bottom side routing and/or top side routing. Adding routing layers on both sides of the interposer is an efficient way of integrating the whole power converter function into a single entity with a very high routing density. The power converter assembly may further comprise routing layers on both sides of the interposer, the routing layers comprising conductive traces. In this embodiment there is, preferably, insulation layers on both sides of the interposer between the interposer and the routing layers to prevent electrical connection between the interposer and the routing layers. The insulation layers preferably have a thickness of at least 100 nm. The buck converter's inductor is then stacked and attached on top of the substrate.

The power converter assembly may further comprise active electrical components stacked on the top side of the interposer. In certain embodiments, the power converter assembly may further comprise an integrated functional application. As an example, the load or application that the power is used for may be integrated. This may involve, for example, a micro controller arranged on the top side of the interposer. In a further embodiment, the load or application may be the integrated circuit arranged in a cavity or pocket of the interposer or monolithically integrated in the interposer. In this embodiment the power converter assembly may comprise a power management integrated circuit stacked on the interposer, wherein the integrated circuit constitutes a load of the power converter assembly. The power converter assembly may further comprise the load and/or an integrated application of the power converter arranged on the top side of the interposer. In one embodiment, the power converter assembly comprises bottom side routing on the bottom side of the interposer. This can be achieved, for example, by post-processing the interposer to add bottom side copper. Similarly, the power converter assembly may comprise top side routing on the top side of the interposer. This can be achieved, for example, by post-processing the interposer to add top side copper. One or more of any of the vias may be connected to the top side routing.

Figure 5:
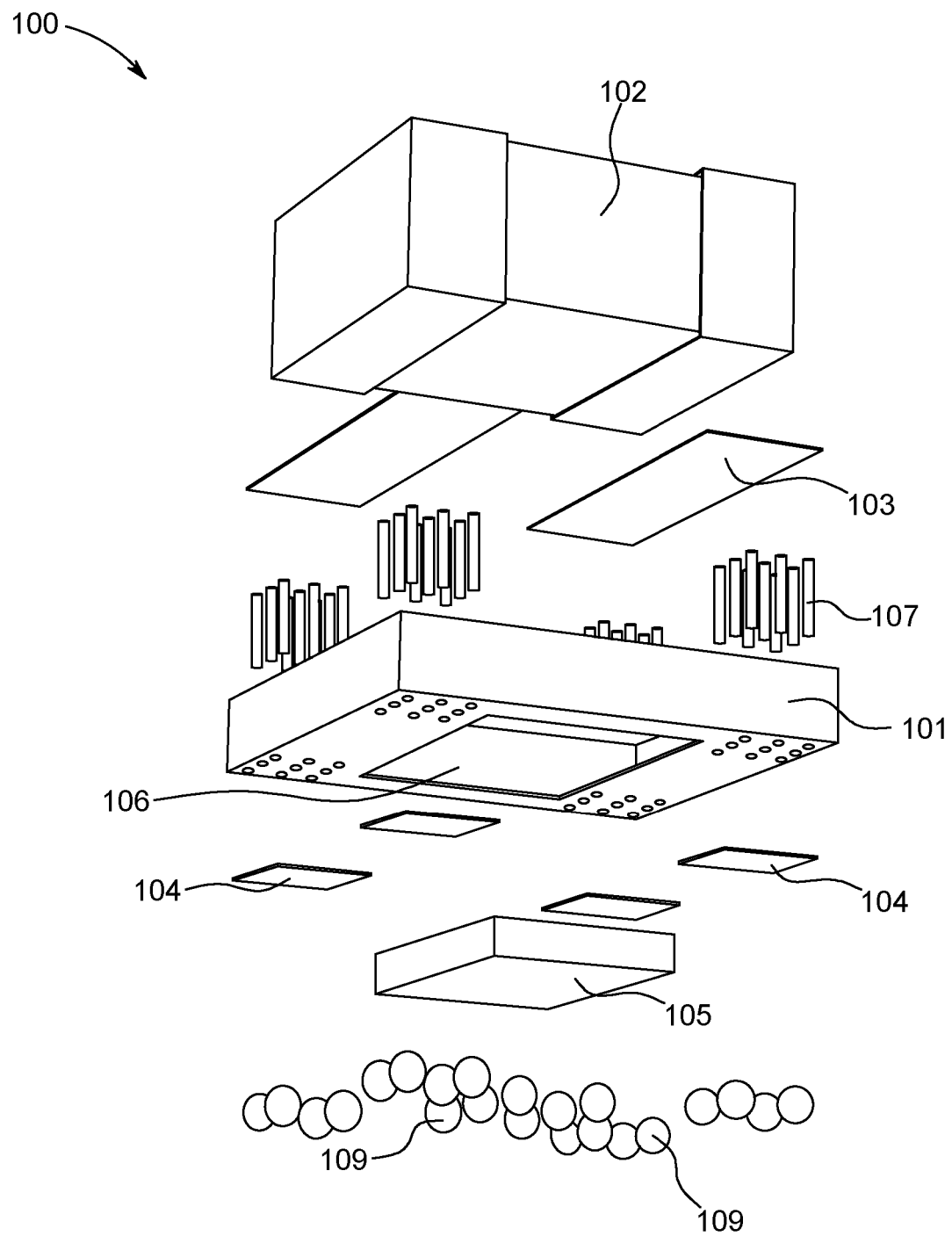
FIG. 5 shows an embodiment of the presently disclosed power converter assembly having an integrated circuit in a cavity of an interposer.

The power converter assembly may further comprise routing layers on both sides of the interposer, the routing layers comprising conductive traces. The thickness of the conductive traces may be between 1 μm and 50 μm. In this embodiment there is, preferably, insulation layers on both sides of the interposer between the interposer and the routing layers to prevent electrical connection between the interposer and the routing layers. Moreover, as illustrated in the example of FIG. 5, the power converter assembly may comprise top-side pads connected to the passive component(s). Each top-side pad may be connected to one or more bottom-side pads through a plurality of parallel through-interposer-vias, such as through-silicon-vias. In this regard it can be noted that the through-vias are configured to carry high electrical current of the power converter, which breaks with the common practice of using through-vias to carry signals. A high electrical current may, in this context, be seen as a current of at least 50 mA, preferably at least 100 mA, more preferably at least 500 mA, even more preferably at least 1000 mA. The through-vias may have a diameter between 10 μm and 100 μm. The plurality of parallel through-interposer-vias represent a way of increasing the current-carrying capability. At the same time, the plurality of parallel through-interposer-vias is a way of increasing the area between the vias and the substrate through which heat can be dissipated. This embodiment can therefore achieve superior thermal cooling performance compared to conventional PCB technology. Preferably, the through-vias comprise an electrical insulation layer towards the interposer. Atomic-layer-deposition aluminum oxide (ALD-AL$_2$O$_3$) may be used as electrical insulation layer. ALD-AL$_2$O$_3$ has properties that can enhance breakdown voltage and increase thermal performance. The following table provides a comparison of SiO$_2$ and ALD-AL$_2$O$_3$.

| Properties | Thermally-growth SiO$_2$ | ALD-AL$_2$O$_3$ |
|---|---|---|
| Thermal conductivity | 1.3 (W/mK) | 2 (W/mK) |
| Dielectric strength | 10 (MV/cm) | 30 (MV/cm) |
| Deposition temperature (e.g. <400 C. ° for CMOS compatible) | 900-1100 C. ° | 150-300 C. ° |

This means that even if a thinner, such as three times thinner, layer of ALD-AL$_2$O$_3$ (compared to SiO$_2$) is used, the same required electrical isolation can be achieved. At the same time 53% better thermal dissipation is achieved. AL$_2$O$_3$ also enables post-CMOS integration due to its low deposition temperature.

Figure 7:
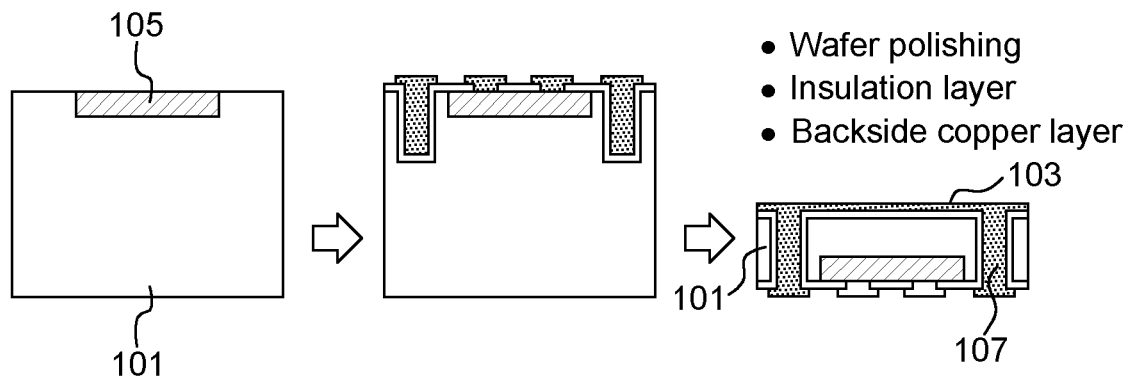
FIG. 7 shows an exemplary embodiment and process of variants of through-vias, such as through-silicon vias.

The power converter assembly can be mounted on a printed circuit board. In this embodiment, further routing may be added to the printed circuit board. In one embodiment of the presently disclosed power converter assembly, the vias comprise first through-interposer-vias from the top side of the interposer to a bottom side of the interposer, wherein the first through-vias form electrical connections between the passive electrical components and routing on the printed circuit board. An example of this is shown in FIG. 5, in which top-side pads (103) are connected to first through-interposer-vias (107) extending through the interposer (101) and connected to bottom-side pads (104). FIG. 5 does not show a printed circuit board, which would be possible to include. In FIG. 5 the integrated circuit (105) is arranged in a cavity (106) of the interposer (101). Therefore, the power converter assembly may comprise top-side pads (103) for connecting the one or more passive electrical components to the through-vias. The power converter assembly may further comprise bottom-side pads (104) connected to the through-interposer-vias (107). The power converter assembly may comprise second through-vias, or any suitable electrical connections, from the bottom side of the interposer to the integrated circuit. For example, the second through-vias may connect a conducting layer or conductive traces of the bottom side with a monolithically embedded integrated circuit or integrated circuit arranged in a cavity of the interposer. If the power converter assembly is mounted on a printed circuit board to bottom-side pads may be connected to routing on the printed circuit board via solder balls. The routing on the printed circuit board is further connected to the integrated circuit from the bottom side of the interposer. If the integrated circuit is exposed, as in FIG. 5, the routing can be connected to terminals of the integrated circuit. The interposer may comprise a lid on a bottom side of the interposer for closing the cavity, thereby encapsulating the integrated circuit in the interposer. If the cavity has a lid, or if the integrated circuit is monolithically integrated in the silicon interposer, vias can be post-processed to form second through-vias from the bottom side of the interposer to the integrated circuit. One non-limiting example of such a process is shown in FIG. 7. The power converter assembly may further comprise third through-vias from the top side of the interposer to the integrated circuit. The third through-vias may be defined as vias connecting a top side conductive layer to monolithically embedded integrated circuit or integrated circuit arranged in a cavity of the interposer.

The thermal conductivity of a material is a measure of its ability to conduct heat. The defining equation for thermal conductivity is $q=-k\Delta T$, where q is the heat flux, k is the thermal conductivity and $\Delta T$ is the temperature gradient. In the International System of Units (SI), thermal conductivity is measured in watts per meter-kelvin (W/(mK)). The presently disclosed power converter assembly may be made of a material having a high thermal conductivity, preferably a thermal conductivity of at least 50 W/(m K), more preferably a thermal conductivity of at least 100 W/(m K), even more preferably a thermal conductivity of at least 150 W/(m K) at 27° C. Silicon has a thermal conductivity of 159 W/(m K) at 27° C.

Figure 6:
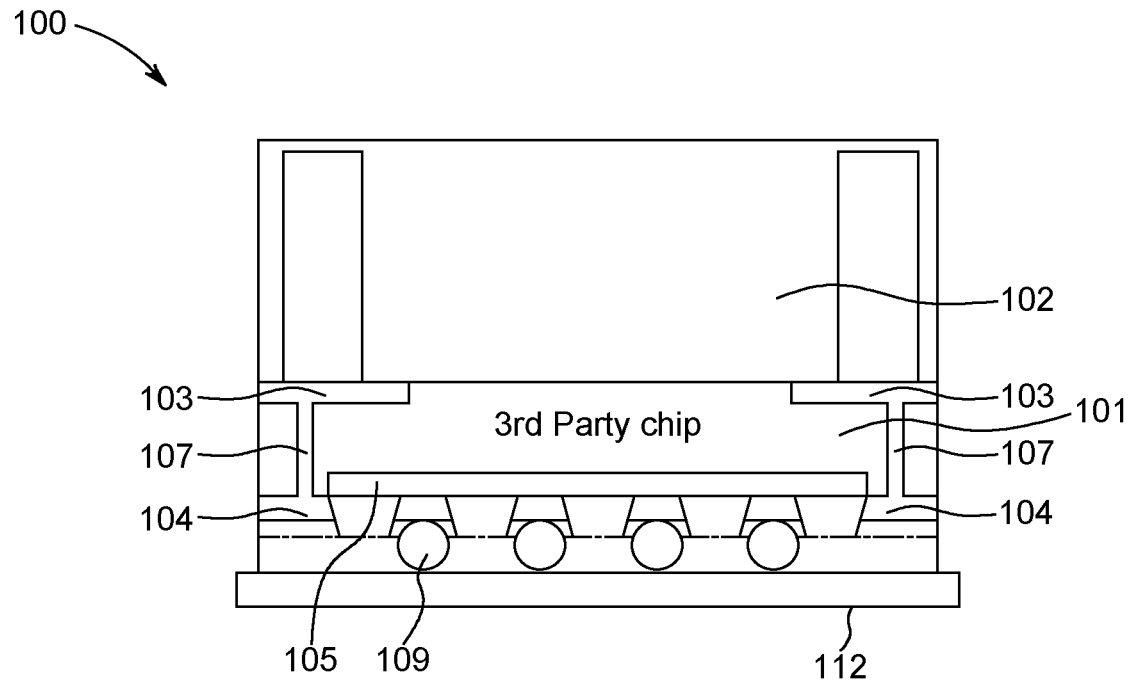
FIG. 6 shows an embodiment of the presently disclosed power converter assembly further comprising a printed circuit board, which could, alternatively, be any other suitable type of substrate, on which the interposer is mounted and in this case may serve as a part of the power converter assembly.

Passive components may comprise capacitors, inductors and/or transformers. In one embodiment of the power converter assembly, the one or more passive electrical components comprise at least one inductor. By using a 3D interposer with an integrated power management circuit and a stacked inductor, not only the thermal performance is improved. The footprint compared to existing power converter solutions can also be significantly reduced. If a relatively large inductor, or several inductors, are stacked on the interposer to cover at least 50% of the surface of the top side, or even 70% or more of the surface of the top side, the performance in terms of power conversion per surface unit can be very high. FIG. 6 shows an example of how an inductor can occupy most of the space of the top surface of the interposer. Furthermore, the one or more passive electrical components may comprise at least one capacitor and/or at least one transformer and/or at least one resistor.

Power management circuits are devices that control the flow and direction of electrical power. Many electrical devices have multiple internal voltages (e.g., 5 V, 3.3 V, 1.8 V, etc.) and sources of external power (e.g., wall outlet, battery, etc.), meaning that the power design of the device has multiple requirements for operation. Power management integrated circuit (PMIC) may refer to devices having an individual power related function or that incorporate more than one function, such as different power conversions and power controls such as voltage supervision and undervoltage protection.

The PMIC may include battery management, voltage regulation, and charging functions. The presently disclosed power converter assembly may be configurable to perform dynamic voltage scaling. In one embodiment the power converter assembly is a DC-DC power converter assembly having multiple input voltage levels and multiple output voltage levels wherein the power management integrated circuit is configured to manage a number of power conversion rates between the input voltage levels and output voltage levels. In one embodiment the DC-DC power converter assembly is configured to convert an input voltage of 2.2-6 V to an output voltage of 0.5-4.2 V.

The power converter assembly may be a DC-DC power converter assembly, such as a buck converter assembly. Other possible converters are boost converters and fly-back converters. The converters of the power converter assembly may be step-up or step-down converters. The power converter assembly may also be a resonant power converter assembly.

In one embodiment of the power converter assembly the one or more electrical components comprise gallium nitride (GaN) transistors. GaN transistors are, in general terms, faster and more efficient than classic silicon devices. GaN has, to some extent, demonstrated the capability to be the displacement technology for silicon semiconductors in power conversion applications. However, the GaN technology is not compatible with the available silicon device processing and manufacturing technology. Therefore, preferably GaN transistors are stacked on the interposer. In one embodiment, the one or more passive electrical components comprise two GaN field-effect transistors, wherein power converter assembly is a GaN half-bridge power stage and wherein the integrated circuit is a gate driver integrated circuit.

The dimensions of the power converter assembly depend on the application and power conversion requirements. However, in order to improve the heat dissipation, the interposer may have a total height (including the integrated circuit) of at least 130% of the height of the integrated circuit. The power converter assembly ma comprise and interposer having a total height of at least 0.2 mm, preferably at least 0.3 mm. FIG. 6 shows an embodiment of the presently disclosed power converter assembly mounted on a printed circuit board. The height of this embodiment is approximately 1.5 mm, including the inductor. The length and width are approximately 2.2 mm. This exemplary embodiment has an input voltage $V_{IN}$=5 V, an output voltage $V_{OUT}$=1.2 V and an output current $I_{OUT}$=1 A.

DETAILED DESCRIPTION OF THE DRAWINGS

The invention will in the following be described in greater detail with reference to the accompanying drawings. The drawings are exemplary and are intended to illustrate some of the features of the presently disclosed power converter assembly, and are not to be construed as limiting to the presently disclosed invention.

Figure 1B:
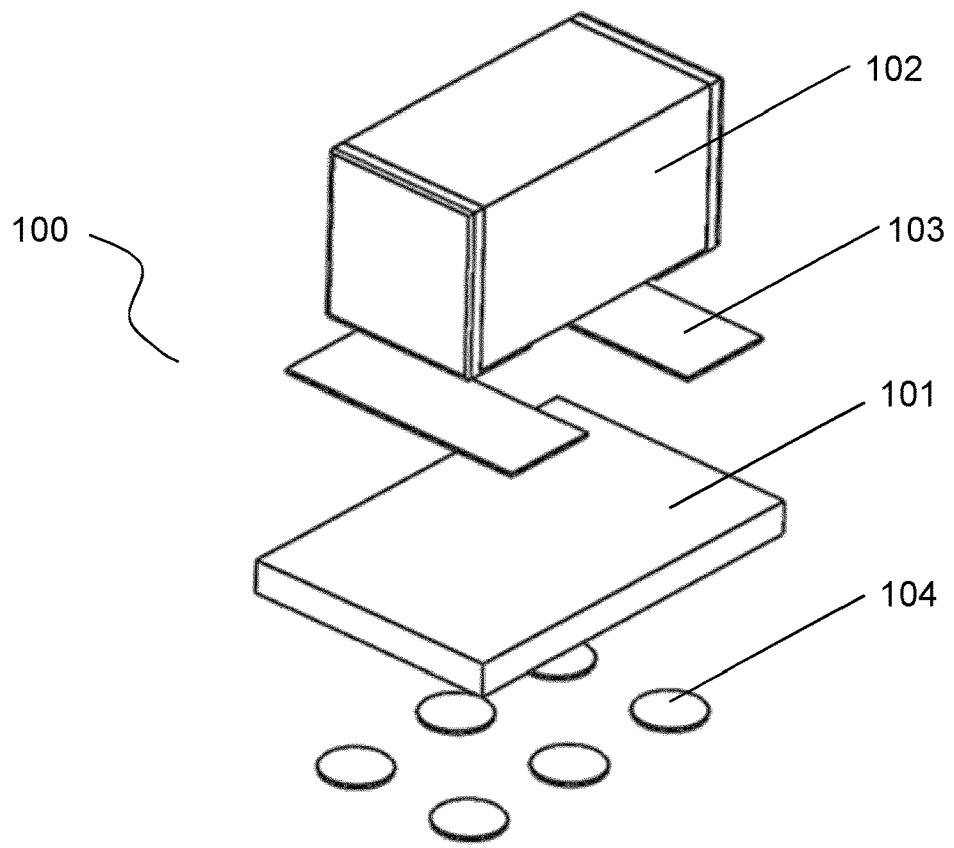

FIG. 1 shows an embodiment of the presently disclosed power converter assembly (100). FIG. 1A shows the assembly (100) in an assembled configuration. FIG. 1B shows the assembly (100) in an exploded view. In this embodiment the integrated circuit is not visible since it is monolithically integrated in the silicon interposer (101). A passive electrical component in the form of an inductor (102) is stacked on the top side of the interposer (101). A pair of top-side pads (103) are connected to the inductor (102). A number of bottom-side pads (104) are arranged on the bottom side of the interposer (101).

Figure 2A:
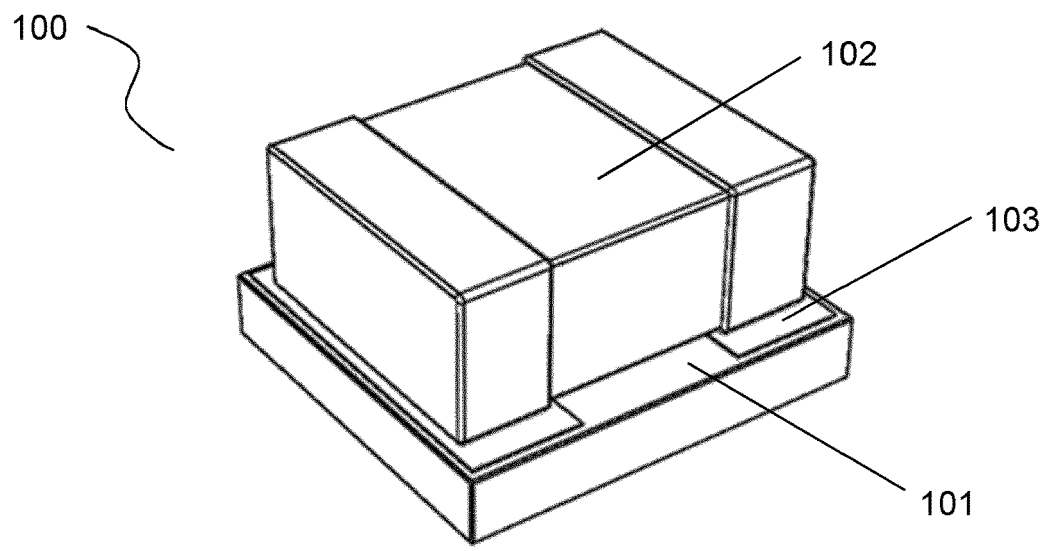
FIG. 2 shows an embodiment of the presently disclosed power converter assembly having an integrated circuit in a cavity of an interposer.
Figure 2B:
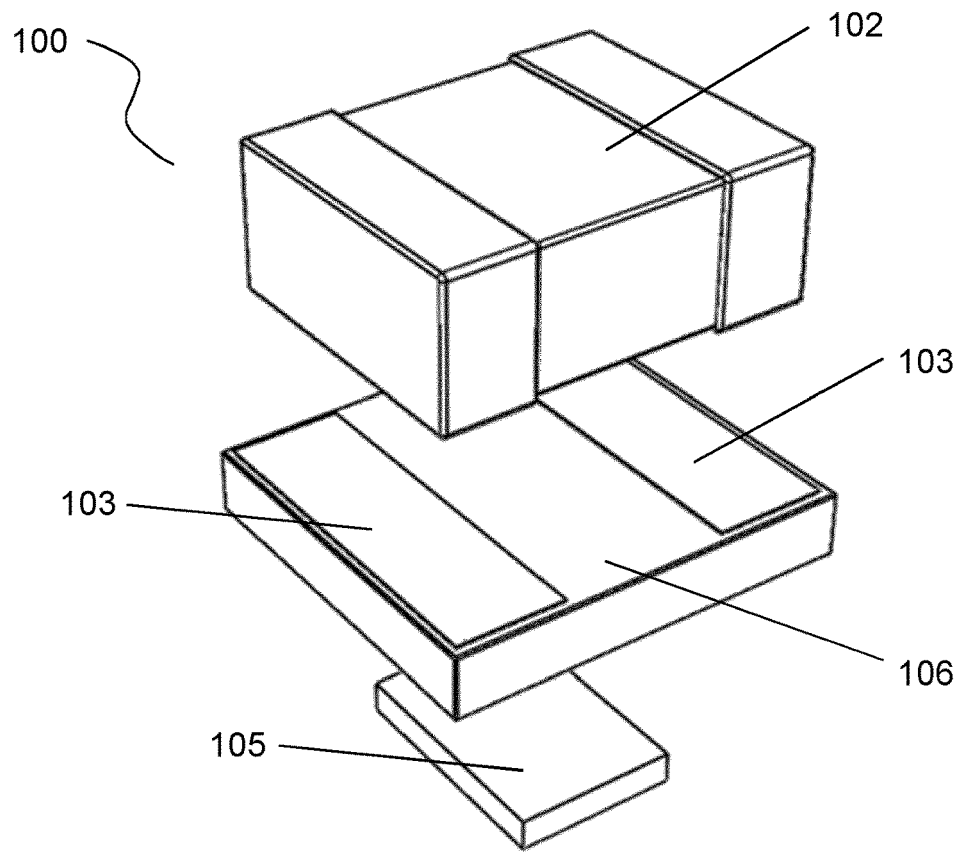

FIG. 2 shows an embodiment of the presently disclosed power converter assembly (100). FIG. 2A shows the assembly (100) in an assembled configuration. FIG. 2B shows the assembly (100) in an exploded view. In this embodiment the integrated circuit (105) is arranged in a cavity (not visible) of the interposer. A passive electrical component in the form of an inductor (102) is stacked on the top side of the interposer (101). A pair of top-side pads (103) are connected to the inductor (102).

Figure 3A:
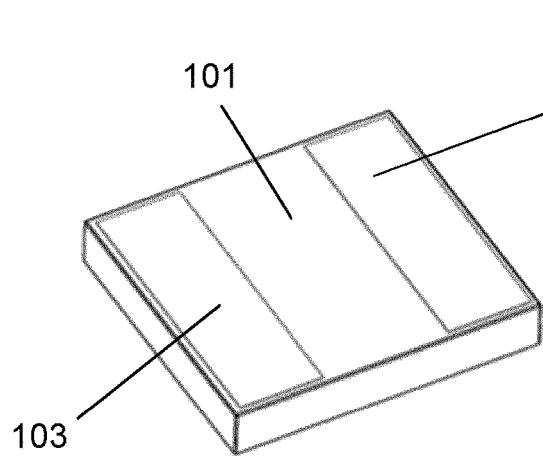
FIG. 3 shows an exemplary embodiment of the presently disclosed interposer.
Figure 3B:
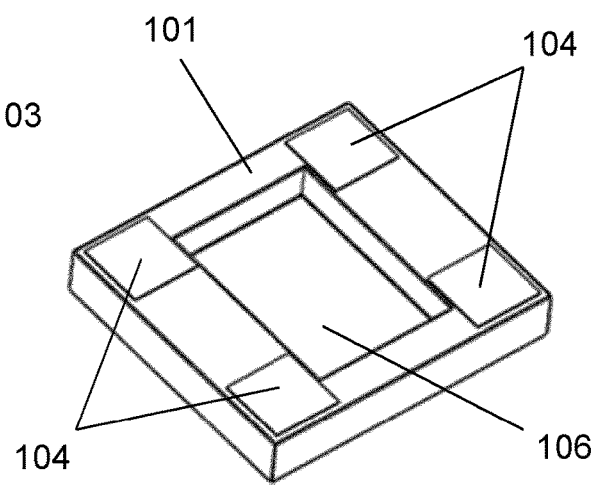
Figure 3C:
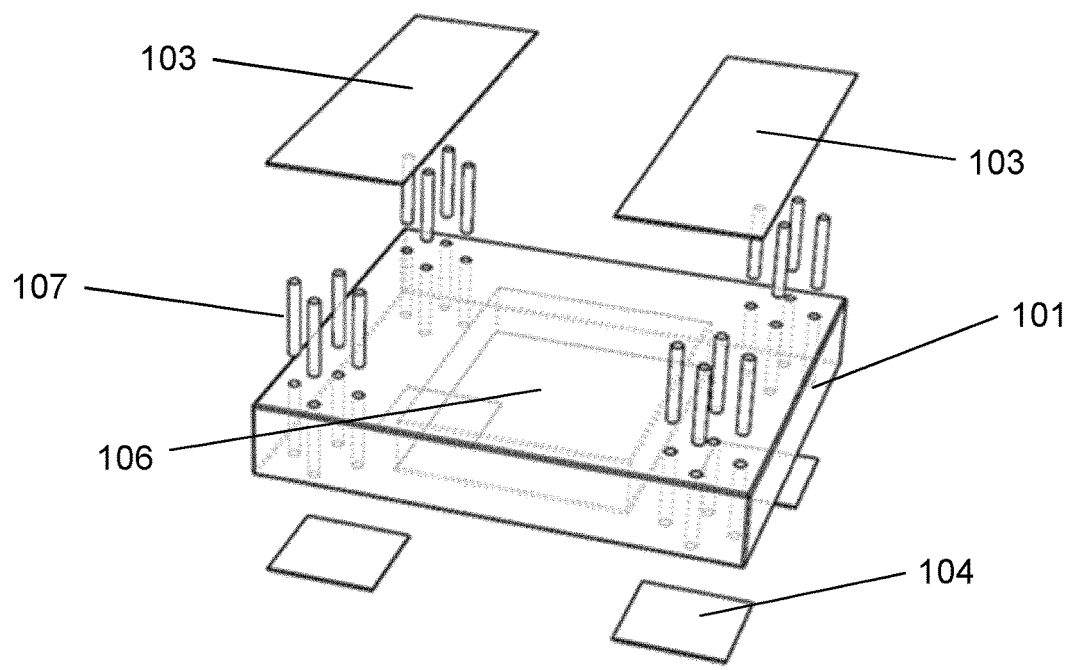

FIG. 3 shows an exemplary embodiment of the presently disclosed interposer (101). FIG. 3A-B show the interposer (101) in an assembled configuration. FIG. 3C shows the interposer (101) in an exploded view. The interposer (101) has a cavity (106), two pair of top-side pads (103) and four bottom-side pads (104). The top-side pads (103) may be connected to a passive component, such as the inductor (102) shown in FIG. 1. Through-interposer-vias (107), such as through-silicon-vias, are arranged in the interposer (101) and form electrical connections between the top-side pads (103) and bottom-side pads (104). The vias (107) are configured in groups of parallel vias connected between a top-side pad (103) and a bottom-side pad (104) to be able to carry power of the power converter assembly and to increase the area between the vias and the interposer (101).

Figure 4A:
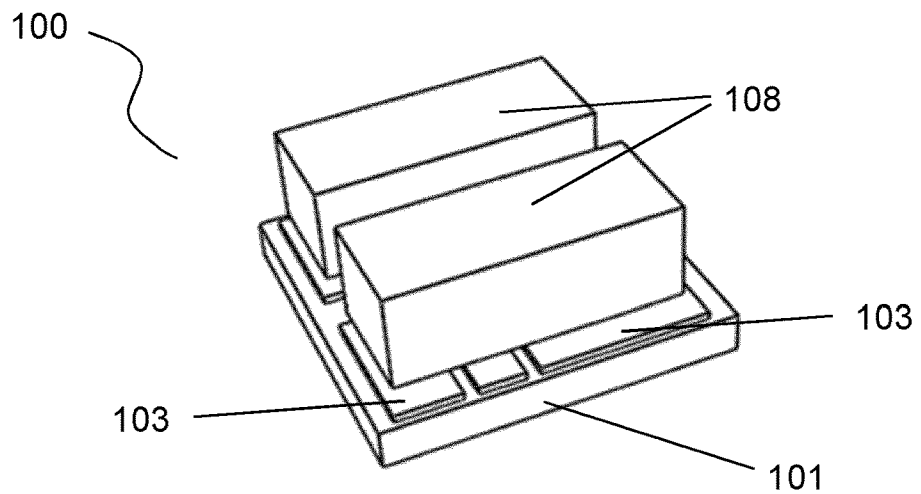
FIG. 4 shows a further embodiment of the presently disclosed power converter assembly having two GaN FETs stacked on top of the interposer.
Figure 4B:
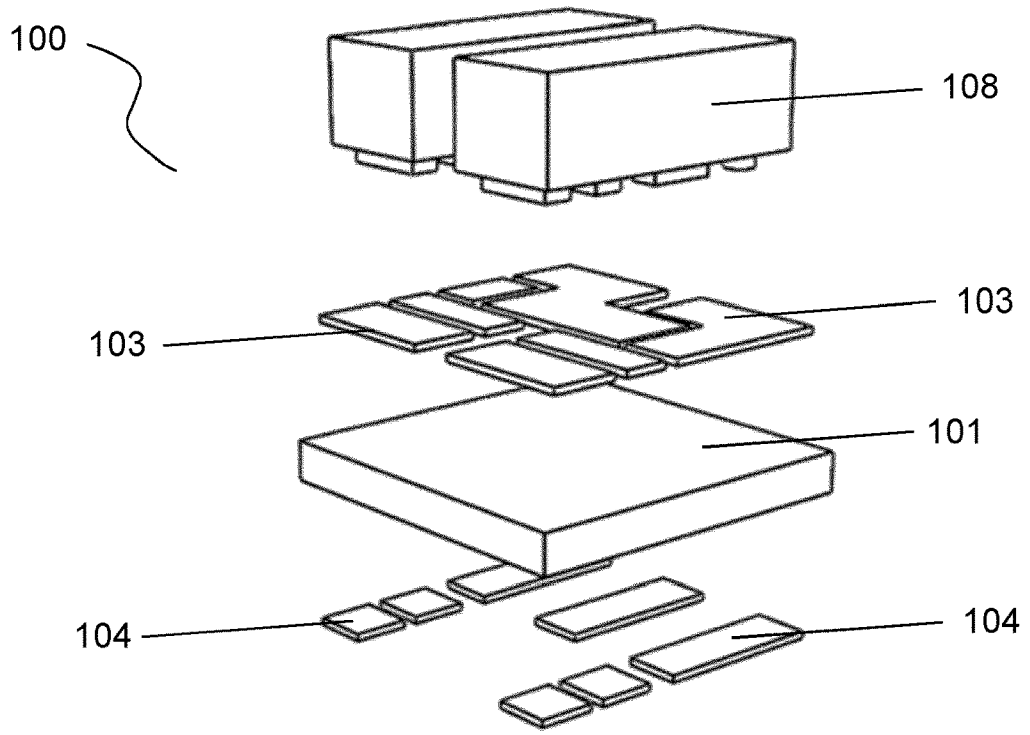

FIG. 4 shows a further embodiment of the presently disclosed power converter assembly (101) having two GaN FETs (108) stacked on top of the interposer (101). FIG. 4A shows the assembly (100) in an assembled configuration. FIG. 4B shows the assembly (100) in an exploded view. In this embodiment the integrated circuit is not visible since it is monolithically integrated in the silicon interposer (101). The interposer (101) has top-side pads (103) and bottom-side pads (104).

FIG. 5 shows an exploded view of an embodiment of the presently disclosed power converter assembly (100). The power converter assembly (100) has an integrated circuit (105) arranged in a cavity (106) of the interposer (101). A passive electrical component in the form of an inductor (102) is stacked on the top side of the interposer (101). A pair of top-side pads (103) are connected to the inductor (102). The top-side pads (103) are further connected to vias (107) extending through the interposer (101) and connected to bottom-side pads (104). The vias (107) are configured in groups of parallel through-interposer-vias connected between a top-side pad (103) and a bottom-side pad (104) to be able to carry power of the power converter assembly. On the bottom side of the power converter assembly solder balls (109) are used to connect the bottom-side pads (104) to bottom side routing. If the integrated circuit (105) is exposed on the bottom side, the routing can be directly connected to electrical connectors of the integrated circuit (105). If the integrated circuit (105) is monolithically integrated in the silicon interposer (101), it may be necessary to have second through-vias (not visible) from the bottom side of the interposer (101) to the integrated circuit (105). There may also be a lid on the cavity (106) of the interposer (101).

FIG. 6 shows an embodiment of the presently disclosed power converter (100) assembly on a printed circuit board (112). The power converter assembly (100) has an integrated circuit (105) embedded in the interposer (101). A passive electrical component in the form of an inductor (102) is stacked on the top side of the interposer (101). Top-side pads (103) are connected to the inductor (102). The top-side pads (103) are further connected to through-interposer-vias (107) extending through the interposer (101) and connected to bottom-side pads (104). The power converter (100) assembly is disposed on a printed circuit board (112). Second through-vias (not visible) are used to connect bottom side routing from the bottom side of the interposer (101) to the integrated circuit (105). insular FIG. 7 shows an exemplary embodiment and process of the through-interposer-vias (107). In FIG. 7, through-interposer-vias (107) are shown. As a person skilled in the art would understand, there are suitable technology processes for making electrical connections to the integrated circuit, including second and/or third through-vias. The vias do not necessarily have to be formed using the exemplary process. Connection between the top side of the interposer (101) and the integrated circuit (105) and/or between the bottom side of the interposer (101) and the integrated circuit (105) can be formed in this manner.

Figure 8A:
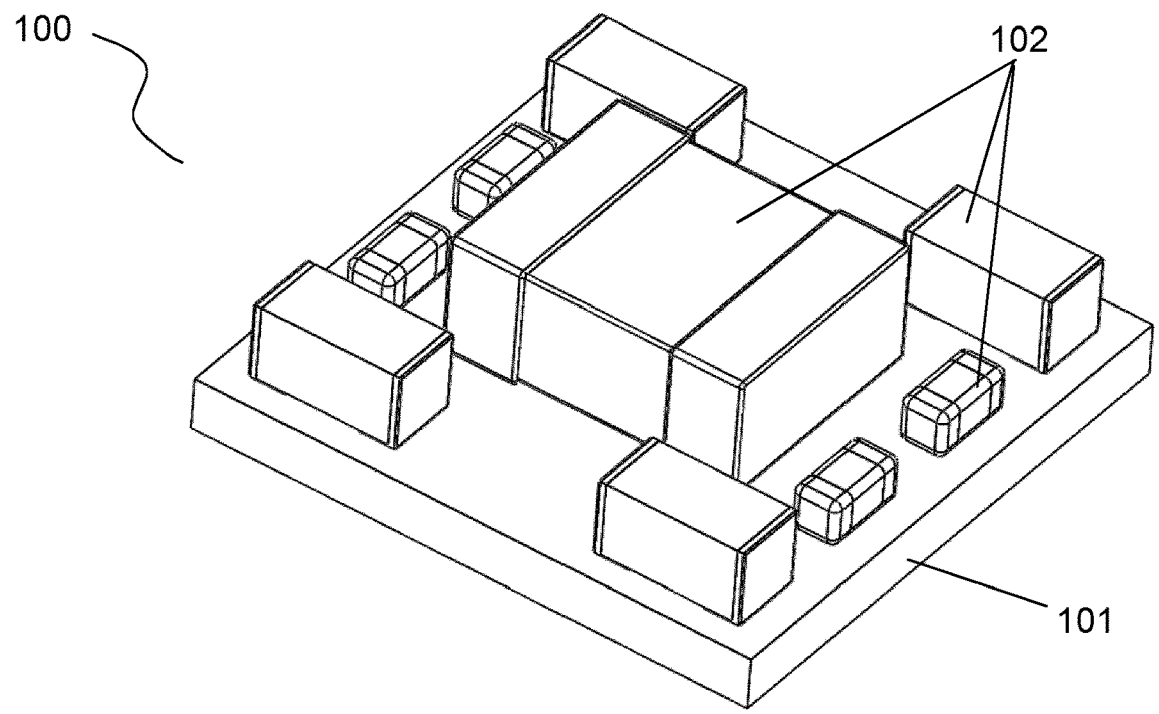
FIG. 8-9 show further embodiment of the presently disclosed power converter assembly.
Figure 8B:
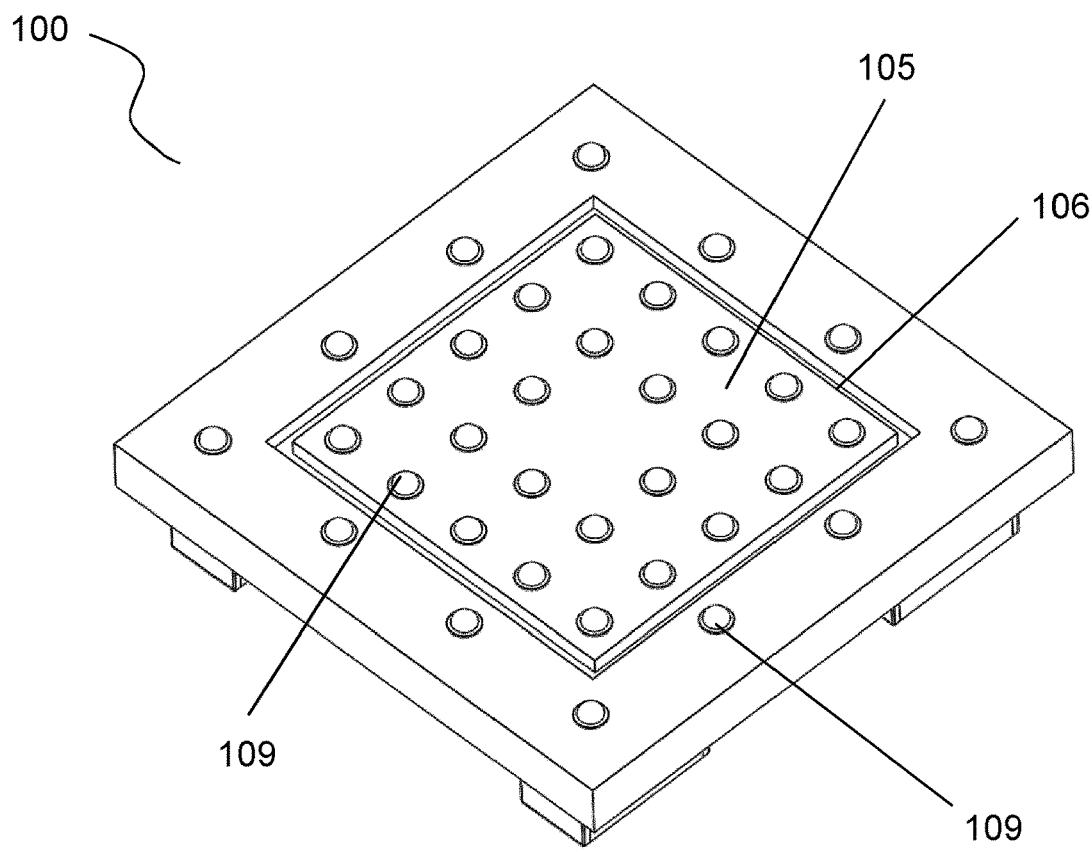

FIG. 8 shows an embodiment of the presently disclosed power converter assembly (100). FIG. 8A shows the assembly (100) from the top side and FIG. 8B shows the assembly (100) from the bottom side. In this embodiment the integrated circuit (105) is a PMIC (105) arranged in a cavity (106) of the interposer. A number of passive electrical components (102) are stacked on the top side of the interposer (101). A number of solder balls (109) on the bottom side of the interposer (101) and integrated circuit (105) can be used to connect the integrated circuit (105) and passive electrical components (102) to routing, which, preferably is disposed on a printed circuit board.

Figure 9:
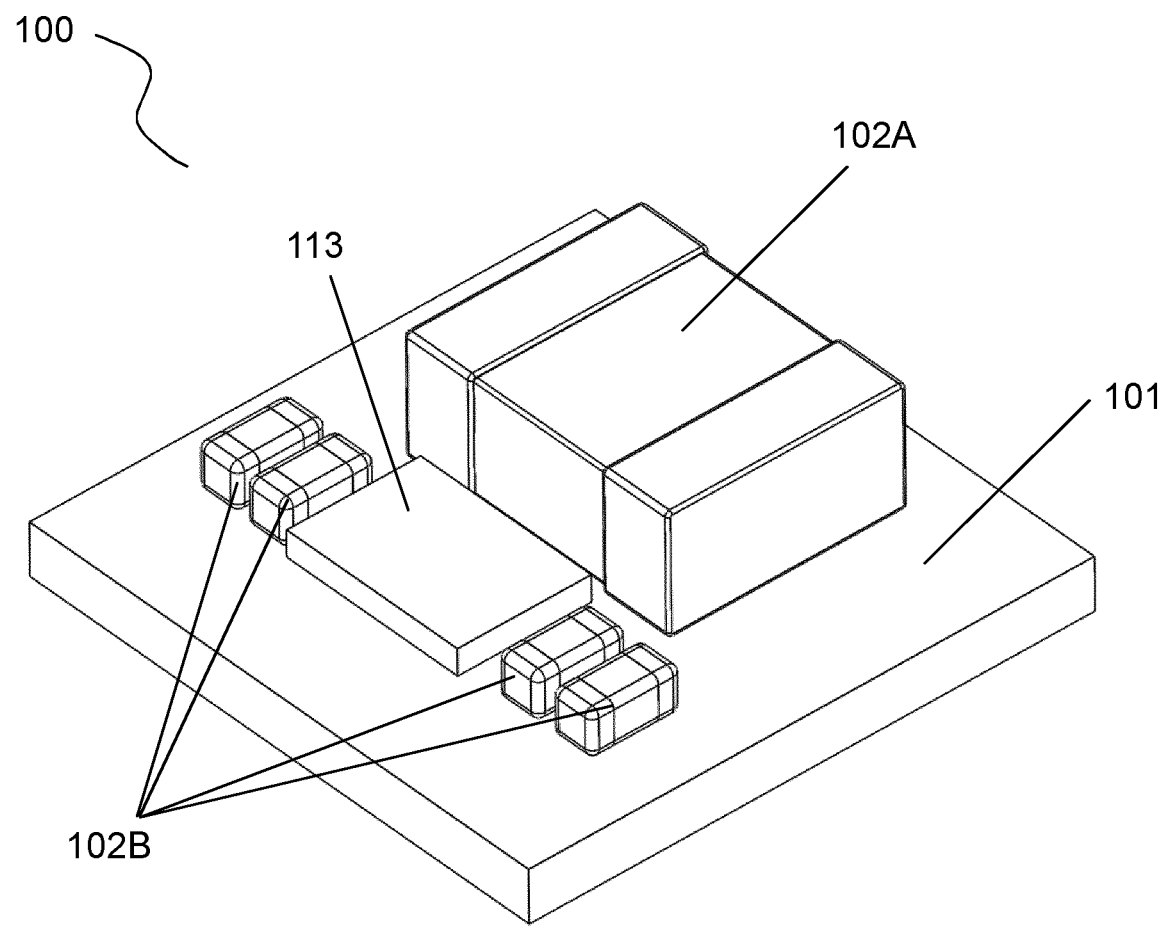

FIG. 9 shows an embodiment of the presently disclosed power converter assembly (100), wherein an integrated circuit (not visible) is integrated in the interposer (101). An inductor (102A), four capacitors (102B) and an additional IC, such as a power management IC (113) in the form of a Buck converter IC, are stacked on the top side of the interposer (101). In this embodiment the integrated circuit (not visible) inside the interposer (101) may be, for example, a micro controller, which may constitute the load or application that is powered by the power converter arrangement.

LIST OF ELEMENTS IN FIGURES

100—power converter assembly
101—interposer
102—passive electrical component
103—top-side pads
104—bottom-side pads
105—integrated circuit
106—cavity
107—through-interposer-vias
108—GaN FET
109—solder balls
112—printed circuit board
113—additional IC/power management IC

The invention claimed is:

1. A power converter assembly comprising:
an interposer;
an integrated circuit, such as a power management integrated circuit, arranged in a cavity or pocket of the interposer or monolithically integrated in the interposer;
one or more electrical components stacked on a top side of the interposer;
one or more vias arranged in the interposer; and
top-side pads connected to the one or more electrical components stacked on the top side of the interposer,
wherein the integrated circuit and the electrical components are configured to perform a power conversion of an input voltage to an output voltage, and
wherein each of the top-side pads is connected to one or more bottom-side pads through a plurality of parallel through-interposer-vias.

2. The power converter assembly according to claim 1, wherein the electrical components comprise passive electrical components and/or active electrical components stacked on the top side of the interposer.

3. The power converter assembly according claim 2, further comprising a printed circuit board, wherein the interposer assembly is mounted on the printed circuit board, wherein a first one of the plurality of parallel through-interposer-vias form electrical connections between the passive electrical components and routing on the printed circuit board, and wherein the routing on the printed circuit board is further connected to the integrated circuit from a bottom side of the interposer.

4. The power converter assembly according to claim 1, wherein the plurality of parallel through-interposer-vias are through-silicon-vias.

5. The power converter assembly according to claim 4, wherein the plurality of parallel through-interposer-vias have a diameter between 10 μm and 100 μm.

6. The power converter assembly according to claim 1, wherein the plurality of parallel through-interposer-vias comprise an electrical insulation layer towards the interposer, wherein the electrical insulation layer is atomic-layer-deposition aluminum oxide (ALD-AL$_2$O$_3$).

7. The power converter assembly according to claim 4, wherein the plurality of parallel through-interposer-vias are configured for carrying high electrical current of the power converter assembly.

8. The power converter assembly according to claim 1, wherein a second one of the plurality of through-interposer-vias forms a connection from a bottom side of the interposer to the integrated circuit.

9. The power converter assembly according to claim 1, wherein a third one of the plurality of through-interposer-vias forms a connection from the top side of the interposer to the integrated circuit.

10. The power converter assembly according to claim 1, further comprising a micro controller arranged on the top side of the interposer, the power converter assembly further comprising a load and/or an integrated application of the power converter arranged on the top side of the interposer.

11. The power converter assembly according to claim 1, further comprising routing layers on both sides of the interposer, the routing layers comprising conductive traces.

12. The power converter assembly according to claim 11, further comprising insulation layers on both sides of the interposer between the interposer and the routing layers to prevent electrical connection between the interposer and the routing layers.

13. The power converter assembly according to claim 1, further comprising a power management integrated circuit stacked on the interposer, wherein the integrated circuit constitutes a load of the power converter assembly.

14. The power converter assembly according to claim 1, wherein the interposer is made of silicon.

15. The power converter assembly according to claim 1, wherein the interposer comprises a lid on a bottom side of the interposer for closing the cavity, thereby encapsulating the integrated circuit in the interposer.

16. The power converter assembly according to claim 1, wherein the integrated circuit is a power management integrated circuit, wherein the power management integrated circuit is configured to perform voltage regulation and/or voltage scaling using the one or more passive electrical components.

17. The power converter assembly according to claim 1, wherein the power converter assembly is a DC-DC power converter assembly or wherein the power converter assembly is a DC-DC power converter assembly and the DC-DC power converter has multiple input voltage levels and multiple output voltage levels and wherein the power management integrated circuit is configured to manage a number of power conversion rates between the input voltage levels and output voltage levels.

18. The power converter assembly according to claim 1, wherein the one or more passive electrical components comprise two GaN field-effect transistors, and wherein power converter assembly is a GaN half-bridge power stage and wherein the integrated circuit is a gate driver integrated circuit.

* * * * *